United States Patent [19]
Andreades et al.

[11] 4,360,570
[45] * Nov. 23, 1982

[54] USE OF PHOTOSENSITIVE STRATUM TO CREATE THROUGH-HOLE CONNECTIONS IN CIRCUIT BOARDS

[75] Inventors: Sam Andreades, Red Bank; Grant A. Beske, Princeton Junction; John W. Lott, Tinton Falls, all of N.J.

[73] Assignee: E. I. Du Pont de Nemours and Company, Wilmington, Del.

[*] Notice: The portion of the term of this patent subsequent to Aug. 11, 1998, has been disclaimed.

[21] Appl. No.: 273,944

[22] Filed: Jun. 15, 1981

Related U.S. Application Data

[63] Continuation-in-part of Ser. No. 132,154, Mar. 20, 1980, Pat. No. 4,283,243, which is a continuation of Ser. No. 954,085, Oct. 24, 1978, abandoned, which is a continuation-in-part of Ser. No. 878,878, Feb. 17, 1978, abandoned.

[30] Foreign Application Priority Data

Feb. 14, 1979 [EP] European Pat. Off. ........... 79100439

[51] Int. Cl.³ .............................................. B32B 3/24
[52] U.S. Cl. ...................................... 428/596; 427/97; 428/551; 428/558; 428/559; 428/601; 428/626; 428/131; 428/137; 428/206; 428/208; 428/209; 428/323; 428/325; 428/328; 428/329; 428/469; 428/901; 428/936; 430/319
[58] Field of Search ............... 156/237, 253, 272, 275, 156/279, 280, 285, 287, 293, 444; 427/43.1, 44, 54.1, 56.1, 97, 98, 294, 296, 304–306; 428/546, 548, 551, 553–556, 558, 559, 596, 597, 601, 615, 621–623, 626, 131, 132, 137, 195, 200, 206–209, 323, 328, 329, 457, 469, 901, 936

[56] References Cited
U.S. PATENT DOCUMENTS
4,283,243 8/1981 Andreades et al. ................. 156/237

Primary Examiner—Bruce H. Hess

[57] ABSTRACT

Electrically conductive through-holes in a substrate are prepared by (a) laminating a film based plastic photosensitive toner-receptive stratum to at least one surface of the substrate; (b) applying a pressure differential across the stratum covering the substrate holes, the outside pressure exceeding that inside the holes; in either order (c) removing at least one film base or (d) exposing the photosensitive stratum imagewise, (e) adhering metal or catalytic particles to hole walls and image areas, (f) optionally hardening or curing the particulate areas and (g) providing an electrically conductive printed circuit and through-holes, e.g., by plating metal electrolessly, soldering or conjoining the metallized or catalyzed areas.

11 Claims, 7 Drawing Figures

USE OF PHOTOSENSITIVE STRATUM TO CREATE THROUGH-HOLE CONNECTIONS IN CIRCUIT BOARDS

CROSS REFERENCE TO RELATED APPLICATIONS

This application is a continuation-in-part of Ser. No. 132,154, filed Mar. 20, 1980, now U.S. Pat. No. 4,283,243 which is a continuation of Ser. No. 954,085, filed Oct. 24, 1978, now abandoned, which is a continuation-in-part of application Ser. No. 878,878 filed Feb. 17, 1978, now abandoned.

DESCRIPTION

1. Technical Field

This invention relates to circuit board preparation and more particularly to such boards having electrically conductive through-holes.

2. Background Art

In preparing printed circuit boards conductive holes are introduced through the boards to accommodate insertion and soldering of electrical component leads and for making electrical connections between two or more circuit patterns. Conductive holes are conventionally introduced by drilling or punching holes through a copper clad, rigid board followed by a plating procedure. The holes are usually plated by a copper reduction procedure such as that disclosed in "Printed Circuits Handbook" edited by Clyde F. Coombs, Jr., published by McGraw-Hill Book Company, New York, New York, 1967, Chapter 5, and in "Printed Circuits and Electronics Assemblies" edited by C. R. Draper, published by Robert Draper Ltd., Teddington, 1969, Chapter 6. The copper clad board with plated-through-holes can then be processed into printed circuit boards using resists and processes as disclosed in the aforementioned "Printed Circuits Handbook" or, for example, in any one of U.S. Pat. Nos. 3,469,982; 3,526,504; 3,547,730; 3,622,334 and 3,837,860. A disadvantage of the conventional copper reduction procedure for plating holes is the waste of expensive catalyst which adheres to the copper cladding as well as the holes, resulting in superfluous overplating of the copper cladding.

Printed circuits can also be prepared by depositing copper conductor patterns directly on insulating substrates by processes such as those disclosed in the following U.S. Pat. Nos. 3,060,024; 3,146,125; 3,259,559; 3,391,455; 3,506,482; 3,562,038; 3,628,999; 3,791,858; 4,054,479 and 4,054,483. The preparation of multilayered printed circuit boards using a photohardenable film and the additive plating process is described in the latter two U.S. patents. In preparing printed circuits with electrically conductive through-holes, e.g., by electroless plating, cleaning procedures are often needed after activation of the holes and circuit lines in order to remove unwanted catalytic material from noncircuit areas before electroless plating. In addition to the cost of the cleaning procedures, expensive catalyst is wasted in noncircuit areas and may be difficult to apply and adhere to the through-holes.

DISCLOSURE OF INVENTION

In accordance with this invention there is provided an element suitable for making printed circuit boards, which comprises (a) a substrate board having through-holes;

(b) a conductive layer on the surface of the board and the through-holes comprising:
  (i) a layer of polymerized insulating adhesive material having embedded therein,
  (ii) a discontinuous layer of conductive particles rendered conductive with,
  (iii) a layer of electroless-plated metal interconnecting the particles; and optionally
  (iv) a layer of metal electroplated over the electroless-plated metal layer.

One method of making the element described above comprises:

(a) laminating a supported plastic photosensitive toner-receptive stratum to at least one surface of the substrate;

(b) applying a pressure differential across the stratum covering the substrate holes, the pressure outside the holes exceeding the pressure inside the holes;

(c) removing the support from at least one plastic photosensitive stratum, wherein the plastic photosensitive stratum over the holes collapses into the holes and the hole walls are continuously coated;

(d) optionally exposing the plastic photosensitive stratum imagewise to actinic radiation through an image-bearing transparency to form toner receptive and nontoner receptive image areas;

(e) adhering metal, alloy or plating catalyst particles to the hole walls and toner-receptive image areas;

(f) optionally hardening or curing the metallized or catalyzed areas;

(g) converting the metallized or catalyzed areas to electrically conductive areas, preferably forming a printed circuit, and electrically conductive through-holes.

DETAILED DESCRIPTION

Figure 1:
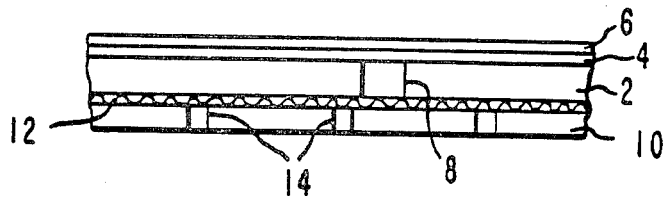
FIG. 1 shows in side elevation and indeterminate width one embodiment of an arrangement of substrate and photosensitive layer for carrying out the process of the present invention.

Referring to the drawings, FIG. 1 shows a substratum 2 which can be an electrically insulating circuit board having a photosensitive toner-receptive stratum 4 laminated thereto and backed up by a film base support 6. The substratum has a through-hole 8 and the stratum 4 and support 6 "tent" over this hole. The substratum 2 is positioned on a vacuum plate 10 having a pitted surface 12 and holes 14 to communicate a vacuum from below the plate 10 to the through-hole 8. This reduces the pressure in hole 8 so that a pressure differential is created across the stratum 4 and support 6 with the atmospheric pressure in contact with support 6.

Figure 2:
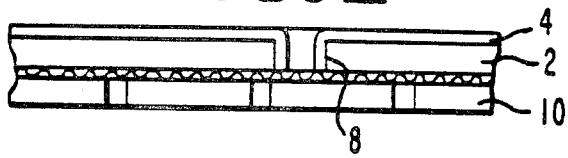
FIG. 2 shows the removal step (c) practiced on the embodiment of FIG. 1.

Upon removal of support 6, the atmospheric pressure causes the stratum 4 to collapse into hole 8 to form a continuous coating on the surface of the hole as shown in FIG. 2. The coating "blows through" the region corresponding to the vacuum plate, so that the plate generally does not become coated with substratum 4. The amount of vacuum drawn on hole 8 through plate 10 to achieve this result will depend on the flowability of the substratum 4 which can be influenced by composition, temperature, and thickness. The support 6 is nonflowable under the conditions of vacuum application, so that the support 6 prevents the substratum 4 from collapsing until the support 6 is removed. The greater flowability of the stratum 4 enables it to flow sufficiently during collapse to form the continuous coating on the wall of the through-hole.

Figure 3:
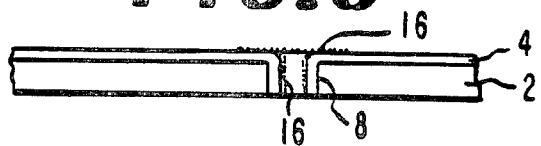
FIG. 3 shows the adhering step (e) practiced after the removal step of FIG. 2.

Upon photoexposure of the stratum 4 through a phototool (not shown) that has an opaque area corresponding to and somewhat larger than the hole 8, the stratum 4 becomes nonadherent except in the unexposed area corresponding to the opaque area in the phototool. The stratum 4 and the hole 8 are dusted with copper powder 16, and this powder adheres only to the unexposed area in the hole 8 and pad area surrounding the hole as shown in FIG. 3. The resultant image of copper powder can then be converted to an electrically conducting pad through-hole by known procedures.

Figure 4:
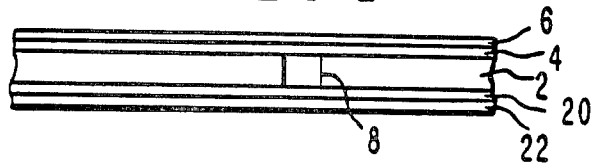
FIG. 4 shows in side elevation and indeterminate width another embodiment of an arrangement of substrate and photosensitive layers for carrying out the process of the present invention.

FIGS. 4 to 7 are similar to FIGS. 1 to 3 except that a stratum 4 and support 6 are laminated to both sides of the substratum 2 as shown in FIG. 4. For clarity, the second stratum and support are indicated as 20 and 22, respectively, in these FIGS. The pressure within hole 8 is less than atmospheric pressure in contact with supports. This is achieved by laminating stratum 4 together with support 6 to substratum 2 under vacuum conditions after stratum 20 and support 22 are laminated to the substratum.

Figure 5:
FIG. 5 shows the removal step (c) practiced on the embodiment of FIG. 4.
Figure 6:
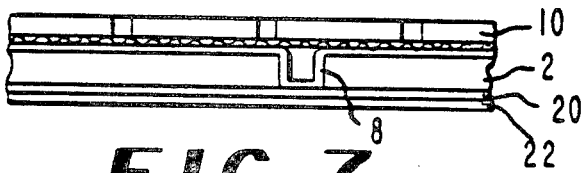
FIG. 6 shows the application of pressure differential across the photosensitive films practiced on the embodiment of FIG. 5.
Figure 7:
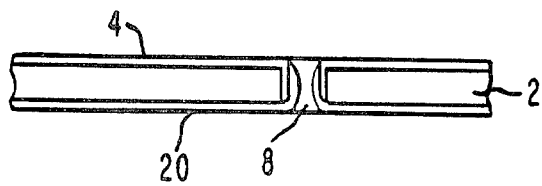
FIG. 7 shows the laminate resulting from the removal of the support in the embodiment of FIG. 6.

Upon removal of support 6, stratum 4 collapses into hole 8 as in the case of FIG. 2 except that stratum 4 also comes into contact with stratum 20 as shown in FIG. 5. The resultant laminate is then exposed to vacuum through-plate 10 to reduce the air pressure in hole 8 as shown in FIG. 6. Upon removal of support 22, stratum 20 collapses into hole 8 by virtue of atmospheric pressure in contact with stratum 20. The collapsed stratum 20 forms a continuous coating within hole 8 over the continuous coating from stratum 4 as shown in FIG. 7. These continuous coatings are stuck together but are somewhat separately identifiable.

The printed circuit substrates or supports employed in the present invention can be any one of the various kinds of sheets, plates, synthetic resin plates, synthetic resin laminated plates or composites, etc. having the necessary electrical and mechanical properties, chemical resistance, heat resistance, impermeability to oxygen, etc. Examples of resins include: phenol-formaldehyde, epoxy and melamine resins, etc. Glass plates, ceramic or ceramic coated metal plates are also useful. The substrate can also be wooden sheet material, paper base phenolic resin laminate, etc., provided that the substrate is substantially impermeable to oxygen and will maintain a vacuum. Metal sheets, e.g., with holes, can be used provided that the material adhered thereto acts as a barrier between the metal sheet support and the metallized circuit. Also useful are self-supported photohardenable elements as disclosed in U.S. Pat. No. 4,054,479.

The through-holes in the printed circuit substrates which may vary in size can be formed, e.g., by drilling, coining or punching holes, as is known to those skilled in the art. Printed circuit substrates with preformed through-holes can also be formed by molding using resinous materials. While generally the through-holes are cylindrical, they may have other shapes as well, for example, they may have a conical or a double-cone cross section: wide on both surfaces and narrower at the center.

The process of the invention can be operated with many types of plastic photosensitive elements. Useful elements comprise an adherent photosensitive toner-receptive stratum or layer contiguous to a strippable support, e.g., a film base support, which preferably transmits actinic radiation. Prior to use, the other side of the photosensitive stratum may have adhered thereto a protective removable cover sheet. The adherent photosensitive toner-receptive strata are prepared from photohardenable compositions, including photopolymerizable compositions capable of addition polymerization as well as photocrosslinkable and photodimerizable compositions. Many specific examples of such photosensitive strata are set forth in the following U.S. Pat. Nos. which are incorporated herein by reference: 3,469,982; 3,526,504; 3,547,730; 3,060,024; 3,622,334; 3,649,268; and French Pat. No. 72 11658. In these particular examples, the unexposed areas are toner-receptive or can be made toner-receptive after subsequent treatment of the composition, e.g., by heating, applying plasticizers or tackifiers to the surface thereof, by applying adhesives, etc. Preferably the photosensitive stratum should be tacky enough to adhere finely divided metal or catalytic particles but not so soft that the particles would become engulfed or heavily coated with the photosensitive composition. A preferred element contains a photohardenable image-yielding stratum on a strippable support. Photohardenable, e.g., photopolymerizable, compositions generally contain at least one binder, ethylenically unsaturated monomers, initiators or initiator system, thermal polymerization inhibitors and other additives such as dyes, pigments, plasticizers, etc. The compositions of the elements and strippable supports are more fully described in U.S. Pat. No. 4,054,483, the disclosure of which is incorporated by reference.

In practicing the invention, the film based, plastic, photosensitive, toner-receptive stratum is laminated to at least one surface of a circuit board substrate having the through-holes. Lamination can be accomplished by methods known to those skilled in the art, e.g., by application of pressure with or without heating using pressure rolls or other apparatus specifically designed for lamination. The lamination procedure can be a suitable method known in the art, e.g., U.S. Pat. Nos. 3,469,982; 3,629,036; 3,984,244; and Belgian Pat. No. 834,269.

Simultaneously with or subsequently to the lamination of the photosensitive stratum to the support, a pressure differential is applied on each side of the stratum covering the substrate holes, the pressure outside the holes exceeding the pressure inside the holes generally at least by 0.5 atmosphere. Application of the pressure differential "on each side of" the stratum is intended to mean that the pressure on one side of the stratum is different from the pressure on the other side of the stratum, which can simply be expressed as applying the pressure differential "across" the stratum. Vacuum frames or vacuum laminators such as Riston® A-1 Vacuum Laminator or Riston® Solder Mask Vacuum Laminator, Model 100, manufactured by E. I. du Pont de Nemours and Company, Inc., Wilmington, Del. as well as other known conventional pumping or evacuating systems can be employed. Preferably both lamination and the pressure differential are applied simultaneously by means of a vacuum laminator.

Either prior to, simultaneously therewith, or after application of the vacuum the removable support on the photosensitive stratum may be removed. If a photosensitive stratum is present on each side of the circuit board substrate, the two supports may be removed either simultaneously or one subsequent to the other. The base support must be removed without damage to the plastic photosensitive toner-receptive stratum. Generally, the base supports are removed satisfactorily at normal room temperature conditions, since the adhesion of the photosensitive stratum to the printed circuit substrate is greater than its adhesion to the base support. If during the process heat is applied to the photosensitive stratum, the stratum should be permitted to cool prior to removal of the support. Alternatively, a support bearing a release coating layer, e.g., silicone, etc., can be used to aid in removal of the support from the photosensitive stratum.

After removal of a support and a pressure differential has been applied as described above, the unexposed plastic photosensitive stratum over the holes collapses into the holes; and the hole walls are continuously coated with a photosensitive layer at least about 0.00005 inch (∼0.0013 mm) in thickness. It may be desirable to assist the collapse of the photosensitive stratum and, if necessary, open the holes if any collapsed photosensitive composition has covered the holes by forming a membrane therein. This is accomplished by heating the stratum to a temperature below its degradation point for a short period of time, generally while the pressure differential is applied.

The thickness of the photosensitive composition continuously lining the holes is dependent on many factors, e.g., the thickness of the photosensitive stratum, the type of photosensitive composition including its flow rate or creep viscosity, the pressure differential, temperature, and the thickness of the substrate. It is essential that the amount of photosensitive layer which lines the holes not plug the holes or be so thick that the holes cannot subsequently be made conductive and receive a component lead.

Useful photosensitive strata range in thickness up to about 0.01 inch (∼0.25 mm). The lower thickness of the photosensitive stratum is determined by the variables discussed above to provide a continuous coating of at least about 0.00005 inch (∼0.0013 mm) in the through-holes. The creep viscosity is an important property in determining which of many photosensitive compositions are useful in the process of the invention. Creep viscosity is determined at a temperature of 40° C. by using a viscometer having a shear rate of $10^{-4}$ sec$^{-1}$. An article entitled "Magnetic Bearing Torsional Creep Apparatus" by D. J. Plazek, Journal of Polymer Science: Part A-2, Volume 6, pages 621-638 (1968) describes one method. Without limiting the invention, the following relationships have been found between creep viscosity, pressure differential, temperature and film thickness. For example: (1) at a creep viscosity up to $0.30 \times 10^8$ poise a photosensitive stratum of up to 0.005 inch (∼0.13 mm) can be used to give at least a 0.00005 inch (∼0.0013 mm) thick continuous coating on the hole walls by operating the process of the invention at normal room temperature, e.g., about 25° C., using a pressure differential of 29.9 inches (75.95 cm) of mercury, and maintaining the laminated supports at least one hour at normal room temperature, generally overnight as in Example 5; (2) at a creep viscosity in the range of greater than $0.30 \times 10^8$ poise to $1.3 \times 10^8$ poise similar photosensitive strata as described in (1) above can be used under the same conditions except that after collapsing any photosensitive composition remaining in the holes which forms a membrane across a hole is opened (membrane broken) by applying additional heat, e.g., 150° C. for 1 to 3 minutes in the holes; (3) at a creep viscosity greater than $1.3 \times 10^8$ poise, e.g., up to $8.2 \times 10^8$ poise or more, photosensitive strata can be used by varying the above conditions, e.g., by increasing the pressure differential and/or the temperature and/or decreasing the thickness of the photosensitive stratum. The above specific values are only given by way of illustration. Those skilled in the art can determine the creep viscosity of other plastic photosensitive compositions and then determine the proper pressure differential and/or temperature and/or thickness of the photosensitive strata to achieve the collapse of the photosensitive strata into the holes continuously lining them.

Prior to removing the support from at least one plastic photosensitive stratum or subsequent to the removal of the support(s), the plastic photosensitive stratum is exposed imagewise through an image bearing transparency and either directly forms or can be rendered to form toner receptive and nontoner receptive image areas as set forth above. Suitable radiation sources depend on the photosensitive composition type. Generally, however, radiation sources that are rich in ultraviolet radiation are useful. Radiation sources are disclosed in U.S. Pat. Nos. 2,760,863 and 3,649,268. The exposure may be through a phototool, negative or positive, having a circuit image including circuit trace. It is understood that the areas of the photosensitive stratum over the through-holes that one wishes to make conductive remain unexposed. While imagewise photoexposure is preferred, such exposure can be omitted, whereby the entire photosensitive stratum remains toner-receptive. Subsequent conversion step (g) would then form a conductive layer on the entire surface of the substrate, similar to metal-clad electrically insulating board often used as a starting material for a printed circuit.

Metal, alloy and plating catalyst particles are applied to the toner receptive and nontoner receptive image areas. Suitable particles that can be subsequently electrolessly plated, soldered, or conjoined or burnished as known in the art include: copper, tin, lead, solder, mixtures of copper and solder, copper-tin alloy, tin-lead alloy, aluminum, gold, silver, palladium, zinc, cobalt, nickel, iron; metal oxides such as titanous oxide, copper oxide, or mixtures thereof, etc. Also useful are metal coated particles, e.g., silver coated glass. The particles have an average diameter of 0.5 to 250 microns, preferably 5 to 25 microns, in average diameter. Copper powder is preferred.

The particles can be adhered (applied) by known methods including, but not limited to, the toning methods described in U.S. Pat. Nos. 3,060,024; 3,391,455; 3,506,483; 3,637,385 and 3,649,268. It is also possible to adhere the particles by use of a fluidized bed of particles as described in *Research Disclosure*, June 1977, No.

15882 by Peiffer and Woodruff. It is important that the excess metal, or plating catalyst particles be removed from the nonadherent image areas. Suitable mechanical and other means for accomplishing this are described in the above-identified U.S. patents and the *Research Disclosure.*

After the metal, alloy or plating catalyst particles have been adhered in the toner-receptive image area and the through-holes, nontoner receptive image areas are cleaned of any extraneous particles, if necessary, and the metallized or catalyzed areas optionally are hardened or cured. Suitable mechanical and other means for removing excess particles are described in the above-mentioned U.S. patents and *Research Disclosure.*

Although a short heating period is preferred to rapidly improve adhesion of metal particles to the adherent image surfaces, other methods may be used. In some instances, the substrate with the particulate metallized image thereon may simply be held at room temperature for a period of time, e.g., overnight, or pressure may be applied to the particulate image. In other instances, the imaged photoadhesive material may be treated with a volatile solvent or plasticizer for adherent image areas either before, during or after the metal particles are applied. Preferably, however, the particulate metallized areas are subsequently hardened or cured by heating, by exposing to actinic radiation, by treating with a suitable hardening or curing catalyst or reagent or other such methods known to those skilled in the art. While the optional but preferred hardening or curing step generally precedes providing the electrically conductive printed circuit and through-holes, the hardening or curing reaction in some instances may be combined with and occur concurrently with providing the conductive circuit. Heating can be carried out by baking, e.g., at about 180° C. or less, generally for 10 seconds to 60 minutes, or by such radiant heating from infrared or microwave sources. The heating temperature must be below the degradation temperature of the adherent composition. The curing or hardening may be accelerated by prior treatment with a suitable catalyst or reagent which may be present on the metal particles or may be applied independently. When the metallized material or area is photohardenable, it may be hardened by uniform exposure of the metallized element to actinic radiation preferably after a short heating period, e.g., 10 to 100 seconds at about 150° to 180° C. The hardening step is dependent on many variables such as the composition used to form the adherent image and its reactivity to heat, light or reagents, the thickness of the applied composition, the mode and conditions of applying hardening energy, etc.

The metallized or catalyzed image areas and through-holes can be converted to corresponding electrically conductive areas by such techniques as electrolessly plating, soldering or conjoining or burnishing the areas. Electroless plating procedures are known to those skilled in the art, e.g., U.S. Pat. No. 4,054,483. The metallized or catalyzed image areas can be directly soldered as taught in Assignee's U.S. application No. 874,352, entitled "Producing Printed Circuits by Soldering Metal Powder Images," filed Feb. 1, 1978 or said areas can be directly conjoined or burnished as taught in Assignee's U.S. application Ser. No. 874,353, entitled "Producing Printed Circuits by Conjoining Metal Powder Images," filed Feb. 1, 1978. For example, the metallized or catalyzed areas can be conjoined by rubbing or burnishing the metallized areas with a silicon carbide brush (3M Co. No. 70S superfine) in a model SBC-12F circuit board cleaning machine (Somaca ®).

It is not necessary to some printed circuit boards that all the through-holes be made electrically conductive. If through-holes are not to be electrically conductive, it is a simple matter to either screen the specific through-holes during application of the metal, alloy or catalytic particles or polymerize the photosensitive composition lining the holes prior to application of the said particles. These through-holes can be exposed during the imagewise exposure. It is preferred in this embodiment that the through-holes have a conical configuration as described above.

The process of the present invention can be repeated on the substrate containing the printed circuit and electrically conductive through-holes obtained from the initial practice of the process. The process can be repeated again on the resulting multilayer printed circuit board formed by the first repetition, and so on. The products of the repetition of the process consist of a plurality of printed circuits interconnected in pairs through common through-holes but the pairs are not electrically interconnected to each other.

BEST MODE FOR CARRYING OUT THE INVENTION

The best mode for the single sided laminate and double sided laminate are illustrated in Examples 7 and 3, respectively. In Example 7 after the laminate is formed by vacuum lamination, the photopolymerizable stratum is imagewise exposed. The laminate is placed on a vacuum frame with its photoexposed laminated surface exposed away from the vacuum. The film support is removed and immediately vacuum is applied and the photopolymerized stratum is gently heated. The stratum collapses into the through-holes completely covering the holes. Subsequently the laminate is toned in a fluidized bed, cured by baking and ultraviolet radiation followed by electrolessly plating. In Example 3, after both sides of the substrate are vacuum laminated with a photopolymerizable stratum, the first polyester support is removed and the first stratum collapses into the through-holes lining them. A polyester film support is vacuum laminated over the collapsed stratum and both strata are imagewise exposed to a positive circuit image. The second support is then removed, whereby the second stratum collapses into the through-holes. After removal of the polyester film support on the first stratum, the laminate is maintained at normal room conditions, e.g., for about 1 hour, wherein the collapsed stratum opens to line the through-holes. Prior to or after removal of polyester film support on the first stratum, the second photopolymer stratum may be gently heated, e.g., 10 to 15 seconds at about 160° C. Subsequently, the laminate is toned in a fluidized bed, hardened by heating, cooled and brushed free of extraneous particles, cured by ultraviolet exposure and then either soldered or electrolessly plated.

INDUSTRIAL APPLICABILITY

The process of this invention is applicable to the preparation of electrically conductive printed circuit boards having electrically conductive through-hole connections. The conductive through-holes can be used to connect electrical components inserted therein to one or two sides of the circuit board or to connect printed circuits on opposite sides of the substrate. Such an electrically conductive printed circuit board also can be used to make multilayer printed circuits utilizing the teaching of Assignee's U.S. Pat. No. 4,157,407 issued June 5, 1979, entitled "Toning and Solvent Washout For Making Conductive Interconnections." By this method it is not necessary to drill or punch the requisite hole and catalyze the through-hole as taught in the prior art. A double sided laminate can be treated on one side according to these inventions to line the through-holes followed by, for example, a method according to Assignee's above-identified application wherein imagewise exposing, toning, developing, and providing electrically conductive interconnections in the photosensitive stratum is accomplished. Additional circuits can then be added to the underlying circuits, if desired.

The conductive through-holes present at appropriate junctures permit electrical connections between layers and/or allow insertion of electrical components to be soldered into the finished boards.

The prepared circuits of this invention can be covered with a solder mask composition and preferably a photosensitive flame retardant solder mask film. Subsequently, an adherent image can be made over the solder mask, and a circuit of the image can be made using the process of this invention. In some instances where the solder mask is photosensitive, the solder mask itself may be used to form an adherent image. An adherent image on either side of the prepared circuit may also be used to add visible nomenclature and/or graphics by toning adherent image areas with suitable pigments. Useful toning procedures and elements are described in U.S. Pat. Nos. 3,060,024; 3,620,726 and 3,649,268.

EXAMPLES

The invention will be illustrated by the following examples wherein the parts are by weight. The creep viscosity in poise is determined at 40° C.

EXAMPLE 1

A polyethylene terephthalate film supported photopolymerizable layer (stratum) (creep viscosity is $0.14 \times 10^8$ poise), 0.003 inch (~0.08 mm) in thickness, of the following composition:

|  | Parts |
| --- | --- |
| Pentaerythritol triacrylate | 25.0 |
| Di-(2-acryloxyethyl) ether of tetrabromo bisphenol-A | 10.0 |
| Di(3-acryloxy-2-hydroxy-propyl) ether of bisphenol-A | 15.0 |
| Methyl methacrylate (46)/acrylonitrile (9)/butadiene (14)/ styrene (31) copolymer | 30.0 |
| Methyl methacrylate (95)/ethyl methacrylate (5) copolymer | 8.0 |
| Michler's ketone | 0.4 |
| Benzophenone | 5.3 |
| Antimony oxide ($Sb_2O_3$) | 6.0 |
| Monastral Green pigment | 0.3 | is laminated to the one side (first) of a glass epoxy board, 1.57 mm thick, having 1 mm diameter holes using a vacuum laminator, Riston® A-1 Vacuum Laminator manufactured by E. I. du Pont de Nemours and Company, Inc., Wilmington, Delaware capable of drawing a vacuum of 29.9 in. of Hg, only the lower platen being heated to 116° C. The second side of the board is vacuum laminated with a polyethylene terephthalate film in a similar manner. The photopolymerizable layer is curved around the board so that the edges are sealed. The polyethylene terephthalate support on the surface of the photopolymerizable layer is cut to leave the board edges still sealed and is then removed. The photopolymerizable layer collapses into the holes completely lining the hole walls to the surface of the polyethylene terephthalate film laminated on the second side of the board. Some of the holes in which the vacuum seal is not as effective, however, are of inferior quality. A polyethylene terephthalate film is laminated to the photopolymerizable surface and the element formed is exposed for 30 seconds through a photographic positive circuit pattern (having opaque areas corresponding to and slightly larger than the holes in the board) to ultraviolet radiation from a 400 watt, medium pressure, mercury vapor lamp in a Model DMVL-HP Double Sided Exposure Frame, a product of Colight, Inc. The polyethylene terephthalate film is removed from the photopolymerizable surface which is dusted with copper powder, Alcan® MD-301 having an average particle size of about 8 microns, manufactured by Alcan Metal Powders Division of Alcan Aluminum Corp., Elizabeth, N.J. Any excess copper is removed, the metallized board is hardened by baking for 40 seconds in an oven at 160° C. (internal reading) and is cleaned with a fine brush. The metallized laminate is passed once through an ultraviolet exposure source at 3.05 m/minute Model PC-7100 UV Processor manufactured by Argus International, Hopewell, N.J., to cure the metallized photopolymer layer. Examination of the metallized board with a 70X microscope shows good copper toning in the through-holes.

The above procedure is repeated except that the glass epoxy boards have 2 mm and 10 mm diameter holes. Good copper toning in the through-holes is revealed upon examination.

The above-described metallized boards are baked for about 15 minutes in an oven at 160° C. (internal reading) and are then plated overnight in a HiD-410 electroless plating bath manufactured by Photocircuit Division, Kollmorgen Corp., Glen Cove, Long Island, N.Y. The lines and through-holes are conductive.

EXAMPLE 2

Polyethylene terephthalate film supported photopolymerizable layers as described in Example 1 are vacuum laminated as described in that Example on the first and second surfaces of a glass, epoxy board 1.57 mm thick and having 1.5 mm diameter through-holes. The sides are exposed consecutively for 30 seconds as described in Example 1, the areas over the holes remaining unpolymerized. The polyethylene terephthalate film support is removed from the first surface, and the photopolymer material on the first surface collapses into the holes completely lining the hole walls to the bottom photopolymer layer. The board is placed with the collapsed surface against a vacuum platen, and the polyethylene terephthalate film support is removed from the second surface. A hot air blower is used to gently heat the uncollapsed photopolymer layer until it collapses into the holes lining them with photopolymer. The laminate, including holes, is toned by placing the laminate in a fluidized bed and toning with the copper particles described in Example 1 insuring that copper particles are forced into the through-holes. The metallized laminate is passed once per side through an ultraviolet exposure source as described in Example 1 to cure the metallized photopolymer layer. The metallized laminate is brushed with an aqueous solder flux, Alpha®

709-F, manufactured by Alpha Metals, Inc., Jersey City, N.J. and is dip soldered for 5 seconds in a solder pot, tin/lead (60/40), and the holes are shaken out. Solder is present throughout the walls of the through-holes.

EXAMPLE 3

Polyethylene terephthalate film supported photopolymerizable layers as described in Example 1 are vacuum laminated as described in that Example on the first and second surfaces of a glass epoxy board having 0.81 mm and 1.17 mm diameter through-holes. The polyethylene terephthalate film support is removed from the first surface, and the photopolymer material on the first surface collapses into the holes completely lining the hole to the bottom photopolymer layer. A polyethylene terephthalate film is vacuum laminated to the collapsed photopolymer surface, and both sides of the laminate are exposed for 30 seconds to a positive circuit image as described in Example 1. The polyethylene terephthalate film on the second surface of the laminate is removed, and the photopolymer on this side collapses into the through-holes and is drawn toward the first side of the laminate. The polyethylene terephthalate film on the first surface is removed, and the laminate is maintained at normal room conditions for about 1 hour wherein the photopolymer membrane over the holes collapses leaving the holes lined with photopolymer. Alternatively, prior to or after removing the support film from the first surface, the second photopolymer stratum on the laminate may be heated for 10 to 15 seconds in an oven at 160° C. (internal reading) followed by removing the first support film whereby the photopolymer layer over the holes immediately collapses into the through-holes lining the walls of the holes. The laminates, including holes, are toned as described in Example 2.

Three laminates are prepared as described in this Example, and the laminates are heated in an oven at 160° C. (internal reading) for 40, 60 and 75 seconds, respectively. After cooling, the metallized laminates are cleaned with a camel hair brush and each laminate is passed once per side through the Model PC-7100 UV Processor as described in Example 1. After soldering as described in Example 2, it is found that the solder is continuous through a large number of the through-holes. This result can be improved by moving the laminates in the molten solder to get solder into all the through-holes.

An additional laminate is prepared as described in this Example up to the soldering step. The ultraviolet cured laminate is baked for 15 minutes in an oven at 160° C. (internal reading) and is placed in an electroless plating bath as described in Example 1 and is plated overnight. The through-holes have an electrically conductive plating.

EXAMPLE 4

Two laminates are prepared as described in Example 3 up to the toning step except that the imaging exposure time is 15 seconds. One laminate is dusted with aluminum particles of average particle size of up to about 89 microns, Fisher A-559, manufactured by Fisher Scientific Company, Fairlawn, N.J. The laminate is baked for 60 seconds in an oven at 150° C. (internal reading), is cooled, is brushed clean with a camel hair brush, and is passed through the UV Processor as described in Example 2. Examination of the laminate shows a uniform toning of aluminum particles on the walls of the holes.

The laminate is electroless plated as described in Example 1. The through-holes have an electrically conductive plating.

The second laminate is dusted with iron particles of average particle size of up to about 53 microns, Fisher I-61, manufactured by Fisher Scientific Company, Fairlawn, N.J. The above heating, cooling, cleaning and curing and electroless plating steps are repeated as described above. The through-holes have an electrically conductive plating.

EXAMPLE 5

Polyethylene terephthalate film supported photopolymerizable layers as described in Example 1, 0.002 inch (0.05 mm) in thickness, are vacuum laminated at 110° C. to both sides of a glass epoxy board with 0.8 mm through-holes by the procedure described in Example 1. The laminate formed is cooled and is imagewise exposed for 10 seconds to actinic radiation as described in Example 1. Both film supports are removed from the laminate simultaneously and the laminate is held overnight. The laminate is heated for 60 seconds in an oven at 150° C. (internal reading) to open the through-holes and the laminate is toned with the copper particles as described in Example 1. After curing both sides in the UV Processor as described in Example 1, the laminate is electrolessly plated as described in Example 1. The through-holes have an electrically conductive plating.

EXAMPLE 6

Example 3 is repeated with the following exceptions:
(a) the photopolymerizable layer (creep viscosity is $0.30 \times 10^8$ poise) has the following composition:

|  | Parts |
|---|---|
| Pentaerythritol triacrylate | 25.0 |
| Di-(3-acryloxy-2-hydroxypropyl) ether of bisphenol-A | 25.0 |
| Michler's ketone | 0.5 |
| Chlorobenzophenone | 6.0 |
| Methyl methacrylate/acrylonitrile/ butadiene/styrene copolymer as described in Example 1 | 33.0 |
| Methyl methacrylate (95)/ethyl methacrylate (5) copolymer | 10.2 |
| Monastral Green Pigment | 0.12 |

(b) the laminate is exposed imagewise for 15 seconds on the exposure device described in Example 1,
(c) the laminate is heated for 1 minute in an oven at 150° C. (internal reading) after removal of the film support and prior to toning,
(d) after toning, the metallized laminate is baked for 1 minute in an oven at 150° C. (internal reading).

Examination of the laminate shows uniform toning of copper particles in the through-holes which are effectively electrolessly plated as described in Example 1 and soldered as described in Example 2.

EXAMPLE 7

A polyethylene terephthalate film supported photopolymerizable layer, 0.0018 inch (~0.04 mm) in thickness of the following composition:

|  | Parts |
|---|---|
| Trimethylol propane triacrylate | 32 |
| Methyl methacrylate/acrylonitrile/ butadiene/styrene copolymer as |  |

|  | Parts |
| --- | --- |
| described in Example 1 | 64 |
| Tertiary butyl anthraquinone | 4 | is laminated to one side of a glass epoxy board having through-holes of the diameter as described in Example 3. The laminated board is imagewise exposed for 15 seconds to the radiation source described in Example 1. The side of the laminate on which no photopolymer layer is laminated is placed on a vacuum platen, the polyethylene terephthalate film is removed, and a vacuum is applied while the photopolymer surface is heated with a hot air blower at 50° to 100° C. The photopolymer layer collapses into the through-holes. The laminate is toned as described in Example 2, is baked for 90 seconds in an oven at 150° C. (internal reading) and is cured in the Model PC-7100 UV Processor as described in Example 1. The holes and circuit lines are uniformly toned with copper which is electrolessly plated overnight as described in Example 1.

EXAMPLE 8

Polyethylene terephthalate film supported photopolymerizable layers (creep viscosity is $0.31 \times 10^8$ poise), 0.0018 inch (~0.04 mm) in the thickness, of the following composition:

|  | Parts |
| --- | --- |
| Trimethylol propane triacrylate | 26.0 |
| Methyl methacrylate/acrylonitrile/ butadiene/styrene copolymer as described in Example 1 | 52.0 |
| Benzophenone | 1.6 |
| Michler's ketone | 0.4 |
| Di-(3-methacryloxy-2-hydroxypropyl) ether of bisphenol-A with 15% styrene diluent | 20.0 | are vacuum laminated to both sides of a 1.57 mm thick glass epoxy board having through-holes of the diameter as described in Example 3. The laminate is cooled and the polyethylene terephthalate film support is removed from the first side whereby the photopolymer on that side collapses into the through-holes completely lining the holes to the bottom photopolymer layer. The collapsed side is relaminated with a polyethylene terephthalate film in the vacuum laminator, and both sides of the laminate are imagewise exposed for 15 seconds to a positive circuit image as described in Example 1. The polyethylene terephthalate film support on the second (uncollapsed) side is removed allowing the photopolymer on that side to collapse. The polyethylene terephthalate film on the first (relaminated) side is removed, and the laminate is heated for 1 minute in an oven at 150° C. (internal reading) to aid in opening the holes, some of which are covered by a thin photopolymer membrane. The surfaces and holes are toned with copper particles as described in Example 1, copper being forced into the open through-holes. The metallized laminate is baked for 2 minutes in an oven at 150° C. (internal reading), is cleaned with a camel hair brush, and is cured on each side as described in Example 1. Copper particles are uniformly present in a majority of the through-holes. This result can be improved upon by deburring of the through-holes in the board. The metallized laminate is electrolessly plated as described in Example 1 to achieve conductive through-holes.

EXAMPLE 9

Example 7 is repeated using a polyethylene terephthalate film supported photopolymerizable layer (creep viscosity is $2.1 \times 10^8$ poise), 0.0018 inch (~0.04 mm) in thickness, of the following composition:

|  | Parts |
| --- | --- |
| Trimethylol propane triacrylate | 32.0 |
| Methyl methacrylate/acrylonitrile/ butadiene/styrene copolymer as described in Example 1 | 66.0 |
| Benzophenone | 1.6 |
| Michler's ketone | 0.4 | and after toning and prior to curing the laminate is baked for 1 minute in an oven at 150° C. (internal reading). A comparable electrolessly plated circuit board with plated through-holes is obtained.

EXAMPLE 10

A polyethylene terephthalate film supported photopolymerizable layer as described in Example 1 is laminated to both sides of a glass epoxy board, 1.57 mm thick, having 0.032 and 0.046 inch (0.8 and 1.17 mm) diameter holes using the vacuum laminator described in Example 1. The polyethylene terephthalate film is stripped off the first side, whereby the photopolymerizable layer collapses into the holes. The polyethylene terephthalate is then stripped off the second side, and the second side is relaminated without vacuum with a silicone release coated polyethylene terephthalate film. The first side is relaminated in vacuum with a polyethylene terephthalate film, a number of the holes being completely broken open during the lamination. This is attributed to the sealing of pockets of air between the release polyethylene terephthalate film and the photopolymerizable layer over the uncollapsed holes. Two samples are prepared by the aforementioned procedure and are exposed on both sides using the exposure device described in Example 1. The silicone release polyethylene terephthalate film is stripped off whereby the photopolymer layer on the second side collapses into the holes which have not previously collapsed due to inadequate pressure differential. The film relaminated to the first side is then removed. One sample is baked for 60 seconds in an oven at 160° C. (internal reading). Both samples are then toned with copper powder as described in Example 1, are baked for 60 seconds in an oven at 160° C. (internal reading), and are cured as described in Example 1. Excellent coverage of the holes walls is obtained. One circuit board is electrolessly plated, and the other circuit board is soldered as described in Examples 1 and 2, respectively.

EXAMPLE 11

Fabrication of an element with circuitry on one side and plated through-holes which are conductive to the other side of a metal (aluminum) board.
Process:
An aluminum panel 0.031 inch thick was drilled with 0.040 inch holes (36 per circuit). The panel was then degreased in methyl chloroform, mechanically scrubbed, mildly etched in an alkaline bath, rinsed in water, placed in a 20% nitric acid bath and finally rinsed in hot water.

Using an HRL-24 Du Pont lamintor, 3 mil photoadhesive was laminated at 2-3 fpm, and 220° F. to one side of the aluminum panel. The cover sheet was removed and the panel was placed on a vacuum platen with photoadhesive coating away from the platen surface. The vacuum was turned on and a heat gun was passed over the surface of the photoadhesive so that the photoadhesive was pulled into the holes and coated the walls. The panels were removed from the platen and heated at 150° C. for 2 minutes, cooled, exposed 30 seconds on a Du Pont exposure, device rich in ultraviolet radiation (DMVL-HP). The panel was then subjected to high UV radiation to cure the photoadhesive on a PC-79 UV cure unit at 10 fpm.

The procedure was repeated for the other side and after UV curing, the panel was baked 1 hour at 150° C.

A layer of photoadhesive film (3.0 mil) was laminated to the top side of the panel as above, exposed to an image which covered all areas of circuitry and plated through-holes leaving a rectangular tacky area that encompassed the circuitry. The film was then collapsed through the holes as above and then the board was dipped into a fluidized bed of 8 micron copper toner so that copper was retained on the tacky areas and on the walls of holes. The panel was then heated at 150° C. for 2 minutes, cooled, rinsed with water to remove excess toner and UV cured at 10 fpm. The panel was then baked 1 hour at 150° C. The cured, toned panels were next plated in a Shipley electroless plating bath for 15 minutes at 120°-130° F., so that a thin conductive layer of copper was present all over the toned areas.

An aqueous developable resist was then used to mask noncircuit areas and the panels were electroplated for 45 minutes. The aqueous resist was then removed leaving a 1.8 mil high electroplated circuit with a thin electroless plating in all noncircuitry areas. The thin electroless plating was etched away leaving only circuitry traces and conductive plated through-holes. All holes were checked and found to be conductive to the backside and no shorting to the substrate was evidenced.

This method could also be applied to circuitry lines on both sides of a board or to a multiple layer circuit with circuits, or finger contacts on two sides of a metal substrate with conductive plated through-holes and interlayer interconnectives made by developing out interconnects, toning, curing and electrolessly plating.

EXAMPLE 12

An aluminum panel was prepared as in the previous example up to the point where the first photoadhesive layer has been applied. The photoadhesive is then imaged with a positive image artwork of the circuitry. The first layer is then drawn into and through the holes. The board is then dipped into a fluidized bed of copper toner that coats the tacky circuit lines and hole walls. The board is baked two minutes at 150° C. to anchor the copper toner, washed to remove excess toner, U.V. cured as above and baked 1 hour at 150° C. The board is then electrolessly plated in a commercial electroless plating bath for 8 hours. The board is then baked 1 hour at 150° C.

After Somaca-cleaning the first layer, the second layer of photoadhesive is laminated to the existing circuit trace at 220° F., at 2-3 fpm, using 40 psi air pressure on the laminator rolls. The layer is exposed to a second circuit trace as above, toned, baked and washed. The circuit trace is then exposed a second time for 2 minutes to a pattern of the holes (interconnectors) leaving the areas of toned photoadhesive where interconnections are desired unexposed while all other areas including toned circuit lines are exposed. The board is then developed in a Du Pont "C" Processor (solvent development) for 60 seconds. This leaves a toned-circuit trace with holes where interconnections are to be made to the lower conductive circuit. The circuit is dipped in the fluidized bed to tone the walls of interconnective holes, baked for 2 minutes at 150° C., washed, UV cured, and baked for 1 hour at 150° C. The circuit is again electrolessly plated for 6-10 hours and then baked again at 150° C. for 1 hour.

Two more layers are added as above.

Finally a thicker layer is added for the fifth or top layer, and a standard (3 mil) thickness layer is added on the opposite side of the board so that connecting fingers can be added to both sides of the completed board.

The top side of the board with the four layers of circuitry and the thicker photoadhesive layer is run through a laminator under 40 psi pressure with a flat metal template heated to around 150°-200° C. placed on top of it. This produces a flat surface for the top circuitry suitable for applying flat packs or integrated circuitry chips.

The bottom side layer and this top layer are then treated as were the second through the fourth layer as listed above.

Finally, a protective layer of soldermask is applied over this top circuitry layer.

Combinations of the methods of Examples 11 and 12 can be used to make multilayers consisting of layers of both electroless and electro-plated circuitry or ground and power planes. Similarly, a multilayer board can be made having only electro-plated layers.

We claim:

1. An element suitable for fabricating printed circuit boards comprising
   (a) a substrate board having through-holes;
   (b) a conductive layer on the surface of the board and the through-holes comprising:
      a layer of polymerized insulating adhesive material having imbedded therein,
      a discontinuous layer of conductive particles rendered conductive with,
      a layer of electroless-plated metal interconnecting the particles; and
      a layer of metal electroplated over the electroless-plated metal layer.

2. The element of claim 1 in which the electroplated layer is in the form of a circuit pattern formed by:
   (a) applying a photoresist film to the electroless-plated layer,
   (b) imagewise exposing the photoresist to form complementary soluble and insoluble image areas defined by the circuit pattern,
   (c) dissolving off the soluble image areas with an appropriate solvent leaving exposed metal defining a circuit pattern with protective resist in noncircuit areas,
   (d) electroplating the exposed circuit areas of metal to form a thick electroplated area,
   (e) stripping off the resist and etching away the electroless-plated layer between the lines of electroplated circuitry.

3. The element of claim 2 on which at least one additional layer is formed by (i) laminating a layer of photoadhesive insulating material on the first circuit layer;
(ii) forming circuit lines by
  (1) optionally imagewise exposing the layer to form tacky and nontacky areas,
  (2) toning the tacky areas with metal powder, alloy, or plating catalyst;
(iii) forming interconnections by
  (1) re-exposing all areas with the exception of areas where interconnections are desired,
  (2) developing out unexposed areas with a suitable solvent, and
  (3) toning the walls of the dissolved-out holes with metal powder, alloy, or plating catalyst;
(iv) hardening or curing the metallized or catalyzed areas; and
(v) rendering circuit lines and interconnections electrically conductive by electrolessly-plating,
(vi) electroplating a layer of metal over the electrolessly-plated metal areas.

4. The element of claim 2 on which at least one additional layer is formed by
(i) laminating a layer of photoadhesive insulating material on the first circuit layer;
(ii) toning with metal powder, alloy, or plating catalyst;
(iii) forming interconnections by
  (1) exposing all areas with the exception of areas where interconnections are desired,
  (2) developing out unexposed areas with a suitable solvent, and
  (3) toning the walls of the dissolved-out holes with metal powder, alloy, or plating catalyst;
(iv) hardening or curing the metallized or catalyzed areas;
(v) rendering areas and interconnections electrically conductive by electroless plating; and
(vi) forming an electroplated layer in the form of a circuit pattern by
  (1) applying a photoresist film to the electroless-plated layer,
  (2) imagewise exposing the photoresist to form complementary soluble and insoluble image areas defined by the circuit pattern,
  (3) dissolving off the soluble images areas with an appropriate solvent, leaving exposed metal defining a circuit pattern with protective resist in noncircuit areas,
  (4) electroplating the exposed circuit areas of metal to form a thick electroplated area,
  (5) stripping off the resist and etching away the electrolessly plated layer between the lines of electroplated circuitry.

5. An element having a first circuit layer formed according to claim 1 on which at least one additional circuit layer is formed by:
(a) laminating a layer of photoadhesive insulating material on the first circuit layer;
(b) forming circuit lines by:
  (i) imagewise exposing the layer to form tacky and nontacky areas,
  (ii) toning the tacky areas with metal powder, alloy, or plating catalyst;
(c) forming interconnections by:
  (i) re-exposing all areas with the exception of areas where interconnections are desired,
  (ii) developing-out unexposed areas with a suitable solvent, and
  (iii) toning the walls of the dissolved-out holes with metal powder, alloy, or plating catalyst;
(d) hardening or curing the metallized or catalyzed areas; and
(e) rendering the toned circuit lines and interconnections conductive by electrolessly plating.

6. An element suitable for fabricating printed circuit boards comprising
(a) a substrate board having through-holes;
(b) a conductive layer on the surface of the board and the through-holes comprising
  a layer of polymerized insulating adhesive material having been applied as a dry film to the surface of the board and to the hole walls by application of a pressure differential, and having imbedded therein,
  a discontinuous layer of conductive particles rendered conductive with,
  a layer of electroless-plated metal interconnecting the particles; and
  a layer of metal electroplated over the electroless-plated metal layer.

7. A multilayer circuit board element having conductive interconnections suitable for fabricating printed circuit boards comprising
(a) a substrate board having through-holes;
(b) a first conductive circuit layer on the surface of the board and the through-holes comprising:
  a layer of photopolymerized insulating adhesive material having imbedded therein imagewise,
  a discontinuous layer of conductive particles rendered conductive with
  a layer of electrolessly-plated metal interconnecting the particles; and
(c) at least one additional circuit layer formed by:
  (i) laminating a layer of photoadhesive insulating material on the first circuit layer;
  (ii) forming circuit lines by
    (1) imagewise exposing the layer to form tacky and nontacky areas,
    (2) toning the tacky areas with metal powder, alloy, or plating catalyst;
  (iii) forming interconnections by
    (1) re-exposing all areas with the exception of areas where interconnections are desired,
    (2) developing out unexposed areas with a suitable solvent, and
    (3) toning the walls of the dissolved-out holes with metal powder, alloy, or plating catalyst;
  (iv) hardening or curing the metallized or catalyzed areas; and
  (v) providing electrically conductive circuit lines and interconnections by electrolessly plating.

8. The element of claim 7 in which the electrolessly plated metal areas on the additional circuit layer are electroplated with a layer of conductive metal.

9. A multilayer circuit board element having conductive interconnections suitable for fabricating printed circuit boards comprising
(a) a substrate board having through-holes;
(b) a first conductive layer on the surface of the board and the through-holes comprising:
  a layer of photopolymerized insulating adhesive material having imbedded therein imagewise,
  a discontinuous layer of conductive particles rendered conductive with
  a layer of electrolessly-plated metal interconnecting the particles; and (c) at least one additional circuit layer formed by
  (i) laminating a layer of photoadhesive insulating material on the first circuit layer;
  (ii) toning the entire layer with metal powder;
  (iii) forming interconnections by:
    (1) exposing all areas with the exception of areas where interconnections are desired,
    (2) developing out unexposed areas with a suitable solvent, and
    (3) toning the walls of the dissolved-out holes with metal powder, alloy, or plating catalyst;
  (iv) hardening or curing the metallized or catalyzed areas; and
  (v) rendering the remaining toned areas electrically conductive surface by electroless-plating;
  (vi) defining a circuit pattern on the electroless-plated layer by
    (1) applying a photoresist film thereto,
    (2) imagewise exposing the photoresist film to form complementary soluble and insoluble image areas defined by the circuit pattern,
    (3) dissolving off the soluble image areas with an appropriate solvent leaving exposed metal defining a circuit pattern with protective resist film in noncircuit areas,
    (4) electroplating the exposed circuit areas of metal to form a thick electroplated area,
    (5) stripping off the resist and etching away the electrolessly-plated layer between the lines of electroplated circuitry.

10. A multilayer circuit board element having conductive interconnections suitable for fabricating printed circuit boards comprising
  (a) a substrate board having through-holes;
  (b) a first conductive layer on the surface of the board and the through-holes comprising:
    a layer of photopolymerized insulating adhesive material having imbedded therein
    either an imagewise or nonimagewise discontinuous layer of conductive particles rendered conductive with
    a layer of electroless-plated metal interconnecting the particles and
    a layer of metal electroplated over the electroless-plated metal layer;
  (c) at least one additional circuit layer formed by
    (i) laminating a layer of photoadhesive insulating material on the first circuit layer;
    (ii) forming circuit lines by
      (1) optionally imagewise exposing the layer to form tacky and nontacky areas,
      (2) toning the tacky areas with metal powder, alloy, or plating catalyst;
    (iii) forming interconnections by:
      (1) re-exposing all areas with the exception of areas where interconnections are desired,
      (2) developing out unexposed areas with a suitable solvent;
      (3) toning the walls of the dissolved-out holes with metal powder, alloy or plating catalyst;
    (iv) hardening or curing the metallized or catalyzed areas;
    (v) providing electrically conductive circuit lines and interconnections by electrolessly plating; and
    (vi) electroplating a layer of metal over the electrolessly-plated metal areas.

11. The element in claim 10 in which the second or top nonimaged electroplated layer is in the form of a circuit pattern formed by:
  (a) applying a photoresist film to the electroless-plated layer,
  (b) imagewise exposing the photoresist to form complementary soluble and insoluble image areas defined by the circuit pattern,
  (c) dissolving off the soluble image areas with an appropriate solvent leaving exposed metal defining a circuit pattern with protective resist in noncircuit areas,
  (d) electroplating the exposed circuit areas of metal to form a thick electroplated area, and
  (e) stripping off the resist and etching away the electrolessly plated layer between the lines of electroplated circuitry.

* * * * *